US007944261B1

(12) United States Patent
Lynch et al.

(10) Patent No.: US 7,944,261 B1
(45) Date of Patent: May 17, 2011

(54) METHOD AND APPARATUS FOR DETECTING CLOCK LOSS

(75) Inventors: Patrick T. Lynch, Edenderry (IE); Amit Wadhwa, Terenure (IE)

(73) Assignee: Xilinx, Inc., San Jose, CA (US)

( * ) Notice: Subject to any disclaimer, the term of this patent is extended or adjusted under 35 U.S.C. 154(b) by 77 days.

(21) Appl. No.: 11/999,194

(22) Filed: Dec. 3, 2007

(51) Int. Cl.
*H03L 7/06* (2006.01)

(52) U.S. Cl. ........ 327/159; 327/146; 327/155; 327/158; 375/375

(58) Field of Classification Search .............. 327/18–21, 327/39–49, 198, 291, 292, 141, 144–163, 327/185, 199–203, 208–212, 214, 218; 331/15–17; 375/373–376; 377/500, 502
See application file for complete search history.

(56) References Cited

U.S. PATENT DOCUMENTS

| 4,752,926 A * | 6/1988 | Goeb ............................ 370/522 |
| 6,587,534 B2 * | 7/2003 | Hassoun et al. .............. 375/376 |
| 2003/0172327 A1 * | 9/2003 | Chen et al. ................... 714/700 |
| 2005/0162199 A1 * | 7/2005 | Green et al. .................. 327/156 |
| 2006/0280276 A1 * | 12/2006 | Chen et al. ................... 375/376 |

OTHER PUBLICATIONS

XAPP462, "Using Digital Clock Managers (DCMs) in Spartan-3 FPGAs," Jan. 5, 2006, 1-68 pgs. Xilinx, Inc. 2100 Logic Drive, San Jose, CA.

* cited by examiner

*Primary Examiner* — Lincoln Donovan
*Assistant Examiner* — Brandon S Cole
(74) *Attorney, Agent, or Firm* — Robert M. Brush; LeRoy D. Maunu

(57) ABSTRACT

Method and apparatus for detecting clock loss in clock circuit. An example of the invention relates to detecting loss of a feedback clock signal input to a digital clock manager, where the feedback clock signal is derived from the reference clock signal. A clock divider is provided to produce a divided feedback clock signal from the feedback clock signal. A first pair of flip-flops is configured to store samples of the divided feedback clock signal on consecutive edges of the reference clock signal. A second pair of flip-flops is configured to store samples of the divided feedback clock signal on consecutive edges of an inversion of the reference clock signal. Detection logic is configured to detect whether each of the first pair of flip-flops and each of the second pair of flip-flops store the same value.

15 Claims, 4 Drawing Sheets

US 7,944,261 B1

METHOD AND APPARATUS FOR DETECTING CLOCK LOSS

FIELD OF THE INVENTION

One or more aspects of the present invention relate generally to digital logic circuits and, more particularly, to a method and apparatus for detecting clock loss.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs), programmable input/output blocks (IOBs), and like type programmable elements. The CLBs and IOBs are interconnected by a programmable interconnect structure. The programmable logic of an FPGA (e.g., CLBs, IOBs, and interconnect structure) is typically programmed by loading a stream of configuration data (known as a bitstream) into internal configuration memory cells. The bitstream is typically stored in an external nonvolatile memory, such as an erasable programmable read only memory (EPROM). The states of the configuration memory cells define how the CLBs, IOBs, interconnect structure, and other programmable logic are configured.

An FPGA may also include various dedicated logic circuits, such as memories, digital clock managers (DCMs), and input/output (I/O) transceivers. Notably, DCMs may be used to perform various clock related functions, such as multiplying/dividing clock frequencies to synthesize new frequencies, mitigating clock skew, condition clock signals to maintain specified duty cycles, and the like. Some clock functions of a DCM, such as a clock deskew function, require both a reference clock and a feedback clock as input. The feedback clock is typically a clock output by the DCM, but including delay added by a clock distribution network in the FPGA. Thus, the feedback clock is obtained from some point on the clock distribution network. If the feedback clock input to the DCM is lost (e.g., due to some problem with the clock distribution network), the DCM will not be able to properly perform the clock deskew function. However, the user's design programmed in the FPGA will operate under the assumption that the deskew function is being performed, which may result in various logic errors. Accordingly, there exists a need in the art for a method and apparatus for detecting clock loss in a digital clock manager.

SUMMARY OF THE INVENTION

An aspect of the invention relates to detecting loss of a feedback clock signal input to a clock circuit. A clock divider is provided to produce a divided feedback clock signal from the feedback clock signal. A first pair of flip-flops is configured to store samples of the divided feedback clock signal on consecutive active edges of the reference clock signal. A second pair of flip-flops is configured to store samples of the divided feedback clock signal on consecutive active edges of an inversion of the reference clock signal. Detection logic is configured to detect whether each of the first pair of flip-flops and each of the second pair of flip-flops store the same logic value.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
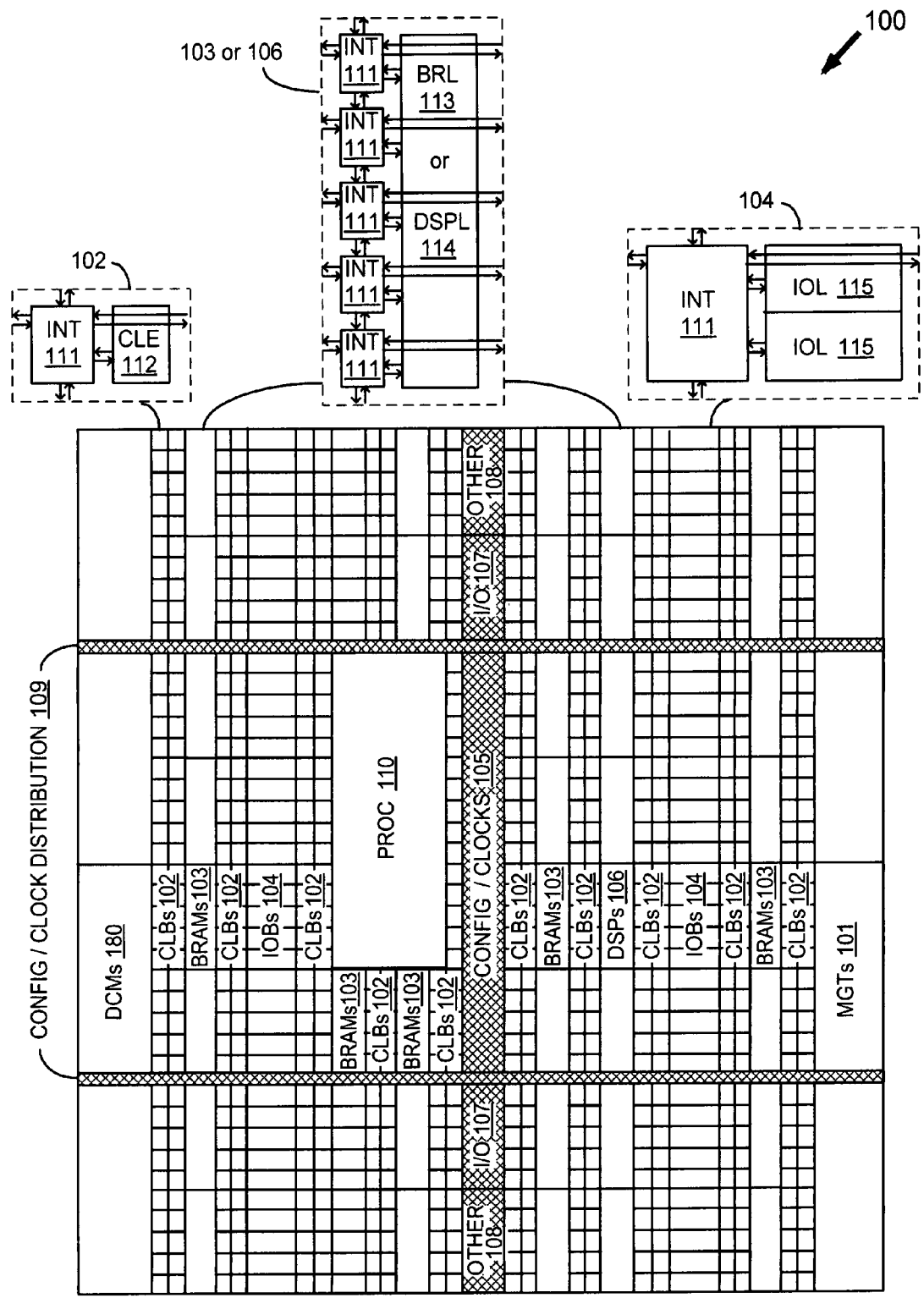
FIG. 1 illustrates an exemplary FPGA architecture.

FIG. 1 illustrates an FPGA architecture 100 that includes a large number of different programmable tiles including multi-gigabit transceivers (MGTs 101), digital clock managers (DCMs) 180, configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such, analog-to-digital converters, system monitoring logic, and so forth. A given set of programmable tiles of an FPGA is referred to herein as a programmable fabric of the FPGA.

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An 10B 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

The FPGA architecture 100 also includes one or more dedicated processor blocks (PROC 110). The processor block 110 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic (e.g., CLBs, IOBs). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art. The processor block 110 is coupled to the programmable logic of the FPGA in a well known manner.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Together, the logic 105 and the logic 109 comprise a clock distribution network in the FPGA. In other embodiments, the configuration logic may be located in different areas of the FPGA die, such as in the corners of the FPGA die. Configuration information for the programmable logic is stored in configuration memory. The configuration logic 105 provides an interface to, and loads configuration data to, the configuration memory. A stream of configuration data ("configuration bitstream") may be coupled to the configuration logic 105, which in turn loads the configuration memory.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations as well as the location of the blocks within the array included at the top of FIG. 1 are purely exemplary. For example, in an actual FPGA more than one adjacent column of CLBs is typically included wherever the CLBs appear, to facilitate the efficient implementation of user logic.

While the examples below are described with respect to a digital clock manager circuit that may be used in an FPGA, the circuits and techniques described may be used with other types of circuits and integrated circuits. In general, the circuits and techniques described may be useful in any device where reliable detection of the loss of a clock signal is needed.

Figure 2:
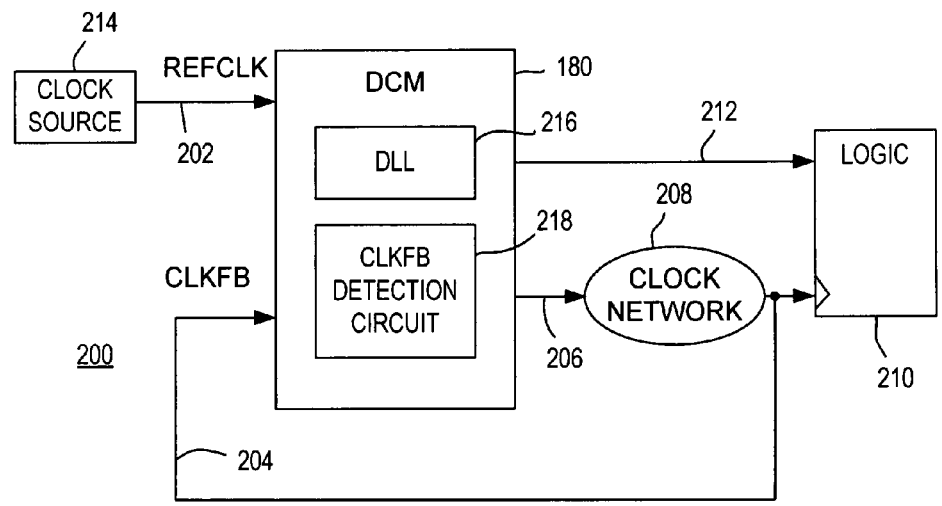
FIG. 2 is a block diagram depicting an exemplary embodiment of a clock management system having a DCM in accordance with one or more aspects of the invention.

FIG. 2 is a block diagram depicting an exemplary embodiment of a clock management system 200 having a DCM 180 in accordance with one or more aspects of the invention. The DCM 180 includes an input 202 configured to receive a first clock signal (referred to as the reference clock or refclk) from a clock source 214. The clock source 214 may be internal to the FPGA 100 or external to the FPGA 100. The DCM 180 includes another input 204 configured to receive a second clock signal (referred to as the feedback clock or clkfb). The DCM 180 also includes an output 206 configured to provide a third clock signal (referred to as the output clock or clk).

The output 206 of the DCM 180 is coupled to an input of a clock network 208. The clock network 208 may comprise all or a portion of the clock distribution network of the FPGA 100. User logic 210 configured in the FPGA 100 is coupled to an output of the clock network 208. The output clock provided by the DCM 180 is used to drive the user logic 210. The input 204 of the DCM 180 is also coupled to the output of the clock network 208. Accordingly, the feedback clock is a sample of the clock provided to the user logic 210, which is a version of the output clock of the DCM 180 with delay added by the clock network 208.

The DCM 180 includes a delay lock loop (DLL) circuit 216 configured to compensate for delay in the output clock introduced by the clock network 208, such delay referred to as clock skew. Thus, the DLL circuit 216 performs a clock deskew function for the DCM 180. For further details with respect to a DCM and its operation, the reader is referred to Xilinx Application Note XAPP462, "Using Digital Clock Managers (DCMs) in Spartan-3 FPGAs," v1.1 published Jan. 5, 2006, which is incorporated by reference herein.

The DCM 180 further includes a feedback (FB) clock lost circuit 218. The feedback clock lost circuit 218 is configured to monitor the feedback clock on the input 204. The feedback clock lost circuit 218 may assert a status signal if the feedback clock is not detected on the input 204 (i.e., the feedback clock is not toggling). The feedback clock lost status signal may be provided via an output 212 of the DCM 180. The output 212 may be coupled to the user logic 210. In this manner, the user logic 210 may be informed in case the feedback clock is not toggling and thus not being used by the DLL 216 in the DCM 180 to properly compensate for clock skew.

Figure 3:
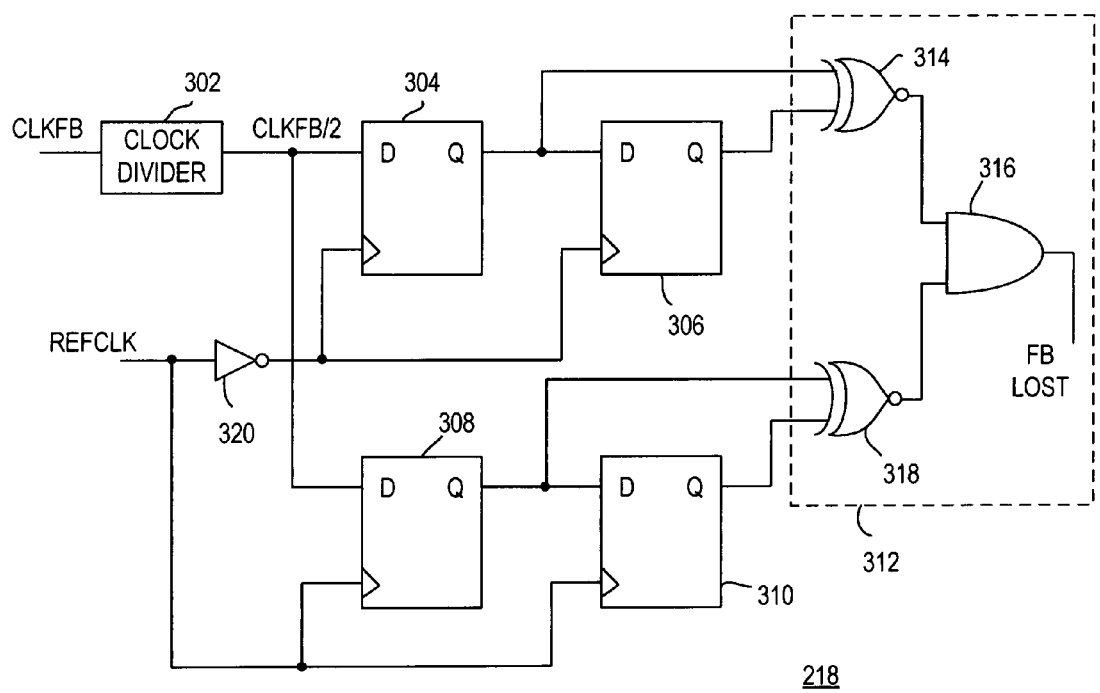
FIG. 3 is a block diagram depicting an exemplary embodiment of a feedback clock lost circuit in accordance with one or more aspects of the invention.

FIG. 3 is a block diagram depicting an exemplary embodiment of the feedback clock lost circuit 218 in accordance with one or more aspects of the invention. The feedback clock lost circuit 218 includes a clock divider 302, flip-flops 304, 306, 308, and 310, an inverter 320, and a detection circuit 312. In some embodiments, the detection circuit 312 includes an exclusive NOR (XNOR) gate 314, an AND gate 316, and an XNOR gate 318. Those skilled in the art will appreciate from the functional description below that the detection circuit 312 may include other logic gate configurations that are equivalent to that shown in FIG. 3.

An input of the clock divider 302 is configured to receive the feedback clock (i.e., the input of the clock divider is coupled to the input 204 of the DCM 180). An output of the clock divider 302 is couple to a data input (D) of the flip-flop 304 and a data input (D) of the flip-flop 308. A data output (Q) of the flip-flop 304 is coupled to a data input (D) of the flip-flop 306 and an input of the XNOR gate 314. A data output of the flip-flop 306 is coupled to another input of the XNOR gate 314. An output of the XNOR gate 314 is coupled to an input of the AND gate 316. The output of the XNOR gate 314 is referred to as signal A.

A data output (Q) of the flip-flop 308 is coupled to a data input (D) of the flip-flop 310 and an input of the XNOR gate 318. A data output (Q) of the flip-flop 310 is coupled to another input of the XNOR gate 318. An output of the XNOR gate 318 is coupled to another input of the AND gate 316. The output of the XNOR gate 318 is referred to as signal B. An output of the AND gate 316 is configured to provide a feedback (FB) lost signal (i.e., the output of the AND gate 316 is coupled to the output 212 of the DCM 180).

An input of the inverter 320 is configured to receive the reference clock signal (i.e., the input of the inverter 320 is coupled to the input 202 of the DCM 180). An output of the inverter 320 is coupled to clock inputs of the flip-flops 304 and 306, respectively. Clock inputs of the flip-flops 308 and 310 are configured to receive the reference clock. Although flip-flops 304, 306, 308, and 310 are shown as positive edge triggered flip-flops, in other embodiments other types of flip-flops, such as negative edge triggered flip-flops, may also be used.

In some embodiments, the feedback clock has the same frequency as the reference clock. In other embodiments, the feedback clock may be a multiple of the frequency of the reference clock (e.g., twice the clock frequency). The clock divider 302 may divide the feedback clock by a factor of at least two. In the exemplary embodiment shown, the clock divider 302 divides the feedback clock by a factor of two and thus the inputs to the flip-flops 304 and 308 are CLKFB/2. Thus, the frequency of the signal input to the flip-flops 304 and 308 is either the same as the reference clock or at least half the frequency of the reference clock.

In operation, the flip-flops 304 and 306 sample CLKFB/2 using the inverted reference clock. If after two active clock edges (e.g., rising edges of the inverted reference clock for positive edge triggered flip-flops) of the inverted reference clock the signal CLKFB/2 does not change, both of the flip-flops 304 and 306 store the same logical value (e.g., either a logic '1' or logic '0'). The output of the XNOR gate 314 (signal A) is then asserted. Otherwise, the flip-flops 304 and 306 store different logical values and the output of the XNOR gate 314 (signal A) is not asserted. Accordingly, the flip-flops 304 and 306 detect whether the signal CLKFB/2 is toggling with respect to the clock edges of the inverted reference clock.

The flip-flops 308 and 310 sample CLKFB/2 using the reference clock. If after two active clock edges (e.g., rising edges of the reference clock for positive edge triggered flip-flops) of the reference clock the signal CLKFB/2 does not change, both of the flip-flops 308 and 310 store the same logical value (e.g., either a logic '1' or logic '0'). The output of the XNOR gate 318 (signal B) is then asserted. Otherwise, the flip-flops 308 and 310 store different logical values and the output of the XNOR gate 318 (signal B) is not asserted. Accordingly, the flip-flops 308 and 310 detect whether the signal CLKFB/2 is toggling with respect to the clock edges of the reference clock.

Thus, the flip-flops 308 and 310 sample the signal CLKFB/2 on the rising edge of the reference clock, and the flip-flops 304 and 306 sample the signal CLKFB/2 on the falling edge of the reference clock. If both signal A and signal B are asserted, the output of the AND gate 316 is asserted, which indicates that the feedback clock has been lost (i.e., the feedback clock is not toggling). If either signal A or signal B is not asserted, the output of the AND gate 316 is not asserted, which indicates that the feedback clock is detected (i.e., toggling). Operation of the CLKFB lost circuit 218 may be further understood with reference to the example below.

Figure 4:
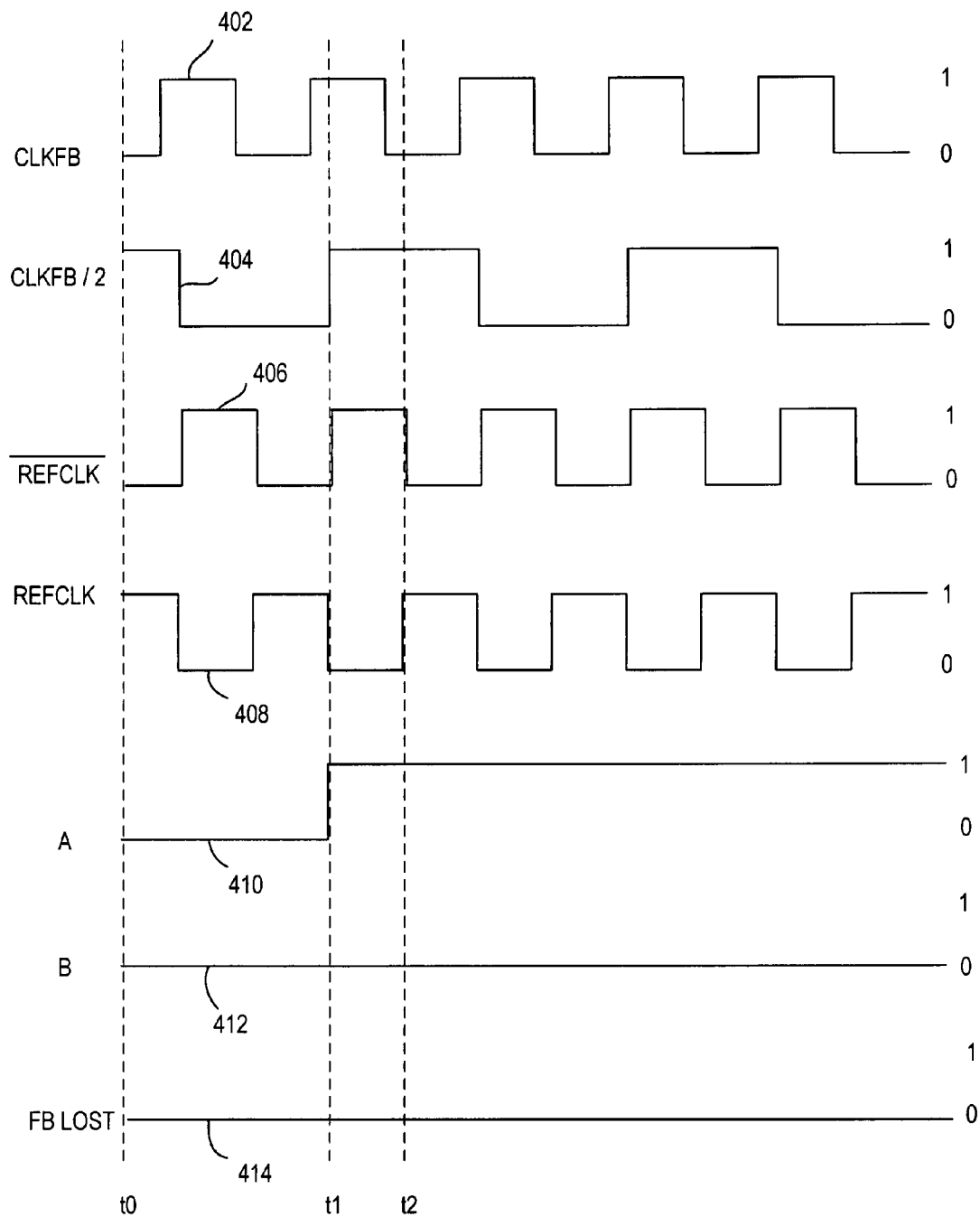
FIG. 4 shows exemplary waveforms for signals in the feedback clock lost circuit of FIG. 3 in accordance with one or more aspects of the invention.

FIG. 4 shows exemplary waveforms for signals in the CLKFB lost circuit 218 in accordance with one or more aspects of the invention. FIG. 4 shows waveform diagrams 402-414 for the feedback clock (CLKFB), the feedback clock divided by two (CLKFB/2), the inverted reference clock, the reference clock, signal A, signal B, and the signal FB lost, respectively. In the present example, the feedback clock has the same frequency as the reference clock.

As discussed above, the DCM 180 uses the reference clock to generate the feedback clock (i.e., the feedback clock is the output of the DCM 180 delayed by the clock network 208). Since the signal CLKFB/2 is derived from the feedback clock, which is derived from the reference clock, in some cases, the rising edges of either the reference clock or the inverted reference clock may be substantially aligned with the edges of signal CLKFB/2. By substantially aligned, it is meant that the rising edges of the inverted reference clock (or the reference clock) and the edges of the signal CLKFB/2 are within the setup time of the flip-flops in the FB lost circuit 218. This may cause the flip-flops 304 and 306, or the flip-flops 308 and 310, to incorrectly report that the feedback clock is not toggling (i.e., either signal A or signal B will be asserted even though the feedback clock is toggling). If the rising edges of one of the reference clock or the inverted reference clock are substantially aligned with the edges of CLKFB/2, the other of the reference clock or the inverted reference clock will not be aligned and thus will properly detect that the feedback clock is toggling.

Assume the flip-flops 304-310 are reset (set to logic '0') at a time t0. As shown in FIG. 4, the rising edges of the inverted reference clock (waveform 406) are substantially aligned with the edges of the signal CLKFB/2 (waveform 404). Thus, after two rising edges of the inverted reference clock (waveform 406), the flip-flops 304 and 306 may each store values of logic '1' or logic '0'. Thus, a time t1, the signal A (waveform 410) may be asserted, despite the fact that the feedback clock (waveform 402) is toggling. The rising edges of the reference clock (waveform 408) are not aligned with the edges of the signal CLKFB/2 (waveform 404). After two rising edges of the reference clock (waveform 408), the flip-flops 308 and 310 store values of logic '0' and logic '1'. Thus, at a time t2, the signal B (waveform 412) remains un-asserted. Accordingly, the signal FB lost (waveform 414) properly indicates that the feedback clock is detected.

Thus, while a pair of flip-flops may be used to detect whether a clock signal is toggling, in the case of the feedback clock input to the DCM 180, use of a single pair of flip-flops may result in false indications that the feedback clock is lost. Accordingly, an aspect of the invention includes two pairs of flip-flops, one pair sampling on the rising edge of a reference clock and the other pair sampling on the negative edge of the reference clock. In this manner, the FB clock lost circuit 218 correctly detects the feedback clock and avoids false indications of lost feedback clock.

Figure 5:
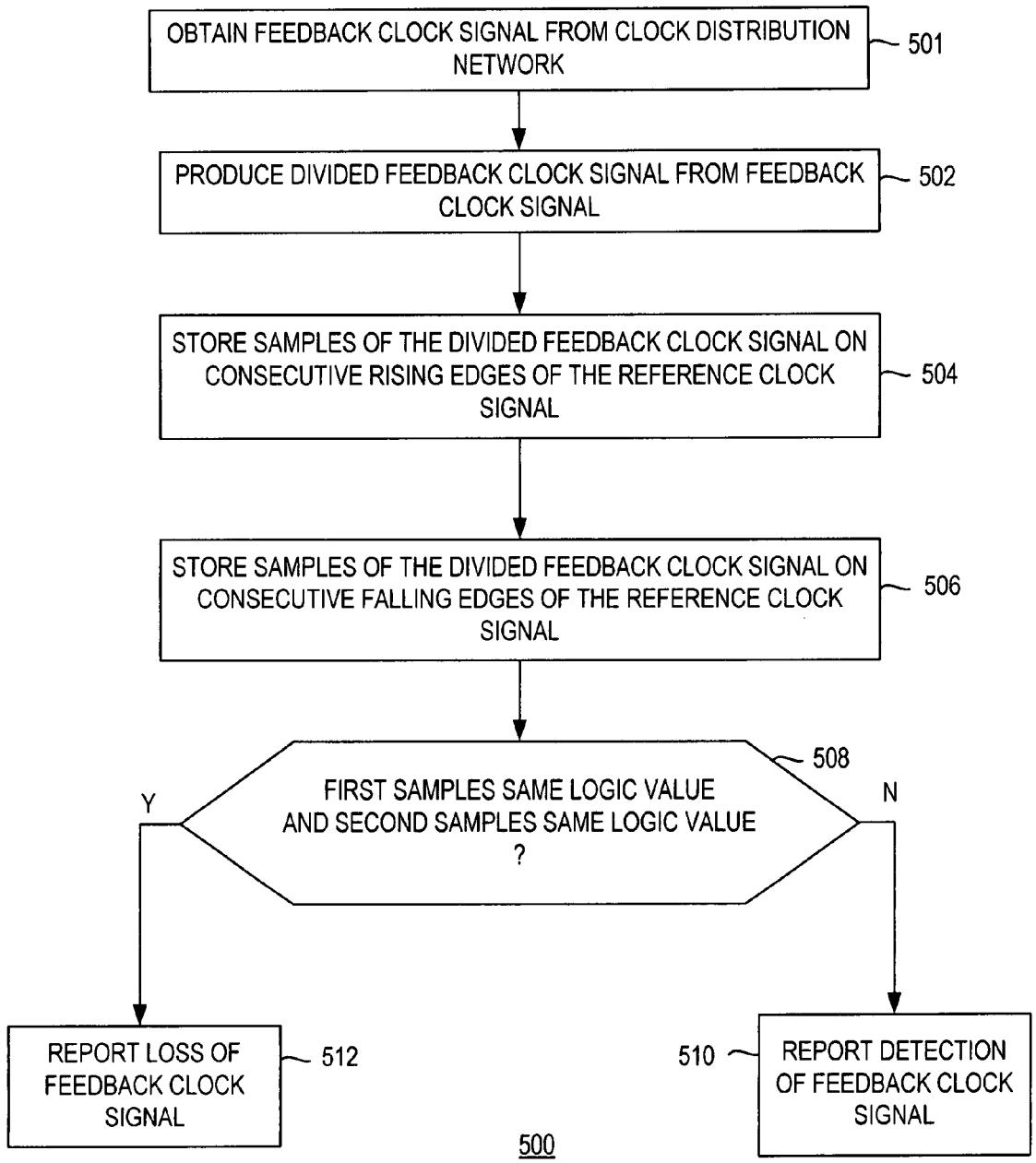
FIG. 5 is a flow diagram depicting an exemplary embodiment of a method for detecting loss of a feedback clock signal input to a DCM in accordance with one or more aspects of the invention.

FIG. 5 is a flow diagram depicting an exemplary embodiment of a method 500 for detecting loss of a feedback clock signal input to a DCM in accordance with one or more aspects of the invention. The method 500 begins at step 501, where the feedback clock signal is obtained from a clock distribution network. At step 502, a divided feedback clock is produced from the feedback clock signal. For example, the feedback clock signal may be divided by a factor of at least two. At step 504, a pair of samples of the divided feedback clock signal is stored on consecutive rising or leading edges of the reference clock signal. At step 506, a pair of samples of the divided feedback clock signal is stored on consecutive falling edges of the reference clock signal. At step 508, a determination is made whether both: (a) the samples in the first pair are the same logic value; and (b) the samples in the second pair are the same logic value. If so, the method 500 proceeds to step 512. If either: (a) the samples in the first pair are different logic values; or (b) the samples in the second pair are different logic values, then the method proceeds to step 510. At step 510, detection of the feedback clock signal is reported. At step 512, loss of the feedback clock is reported.

Method and apparatus for detecting clock loss in a digital clock manager is described. In some embodiments, a DCM is configured to detect loss of a feedback clock signal derived from a reference clock signal and delayed with respect to the reference clock signal due to transmission through a clock distribution network (e.g., a clock distribution network in an FPGA). The feedback clock may be divided and may be sampled on both the rising and falling edges of the reference clock. In this manner, two signals are generated that can be used to indicate whether the feedback clock is lost (e.g., the feedback clock is reported as being lost only if both of the signals indicate the loss). This is advantageous compared to sampling the feedback clock using only one edge of the reference clock, since in such cases subtle movements in the feedback clock may result in setup time violations in the detection logic. By sampling the feedback clock on both the rising and falling edges of the reference clock, a sample missed on the rising edge due to a setup time violation will be identified on the falling edge sample.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. Apparatus for detecting loss of a feedback clock signal input to a clock circuit comprising:
    a clock divider configured to produce a divided feedback clock signal from the feedback clock signal, the feedback clock signal being derived from a reference clock signal by a digital clock manager (DCM) and delayed by a clock network coupled to the DCM;
    a first pair of flip-flops configured to store samples of the divided feedback clock signal on consecutive active edges of the reference clock signal;
    a second pair of flip-flops configured to store samples of the divided feedback clock signal on consecutive active edges of an inversion of the reference clock signal; and
    a detection circuit configured to detect whether each of the first pair of flip-flops and each of the second pair of flip-flops store the same value, wherein the detection circuit reports the loss of the feedback clock signal if the samples in the first pair of flip-flops are the same value and the samples in the second pair of flip-flops are the same value;
    wherein a frequency of the feedback clock signal is either the same as a frequency of the reference clock signal or a multiple of the frequency of the reference clock signal, and
    wherein the clock divider divides the feedback clock signal by a factor of at least two.

2. The apparatus of claim 1, wherein the first pair of flip-flops comprises:
    a first flip-flop having a data input coupled to the clock divider, a clock input configured to receive the reference clock signal, and an output; and
    a second flip-flop having a data input coupled to the output of the first flip-flop, a clock input configured to receive the reference clock signal, and an output.

3. The apparatus of claim 2, wherein the second pair of flip-flops comprises:
    a third flip-flop having a data input coupled to the clock divider, a clock input configured to receive the inversion of the reference clock signal, and an output; and
    a fourth flip-flop having a data input coupled to the output of the third flip-flop, a clock input configured to receive the inversion of the reference clock signal, and an output.

4. The apparatus of claim 2, wherein the detection circuit comprises:
    a first logic gate having inputs coupled to the output of the first flip-flop and the output of the second flip-flop, respectively, and an output;
    a second logic gate having inputs coupled to the output of the third flip-flop and the output of the fourth flip-flop, respectively, and an output; and
    a third logic gate having inputs coupled to the output of the first logic gate and the second logic gate, respectively.

5. The apparatus of claim 1, further comprising:
    an inverter configured to provide the inversion of the reference clock signal.

6. The apparatus of claim 1, wherein the clock circuit is a digital clock manager.

7. A method of detecting loss of a feedback clock signal input to a clock circuit, the method comprising:
    producing a divided feedback clock signal from the feedback clock signal, the feedback clock signal being derived from a reference clock signal by a digital clock manager (DCM) and delayed by a clock network coupled to the DCM;
    storing a first pair of samples of the divided feedback clock signal on consecutive rising edges of the reference clock signal;
    storing a second pair of samples of the divided feedback clock signal on consecutive falling edges of the reference clock signal; and
    reporting a loss of the feedback clock signal if the samples in the first pair are the same value, and the samples in the second pair are the same value;
    wherein a frequency of the feedback clock signal is either the same as a frequency of the reference clock signal or a multiple of the frequency of the reference clock signal; and
    wherein a frequency of the divided feedback clock signal is at least half the frequency of the feedback clock signal.

8. The method of claim 7, further comprising:
    reporting detection of the feedback clock signal if the samples in at least one of the first pair and the second pair are different values.

9. The method of claim 7, further comprising:
    obtaining the feedback clock signal from a clock distribution network.

10. The method of claim 7, wherein the clock circuit is a digital clock manager.

11. An integrated circuit, comprising:
    a digital clock manager (DCM) having inputs configured to receive a reference clock signal and a feedback clock signal, and an output for providing an output clock signal derived from the reference clock signal;
    a clock distribution network configured to distribute the output clock signal and provide the feedback clock signal, the feedback clock signal being a delayed version of the output clock signal;
    a feedback clock detection circuit in the DCM, including:
        a clock divider configured to produce a divided feedback clock signal from the feedback clock signal;
        a first pair of flip-flops configured to store samples of the divided feedback clock signal on consecutive active edges of the reference clock signal;
        a second pair of flip-flops configured to store samples of the divided feedback clock signal on consecutive active edges of an inversion of the reference clock signal; and
        a detection circuit configured to detect whether each of the first pair of flip-flops and each of the second pair of flip-flops store the same value, wherein the detection circuit reports the loss of the feedback clock signal if the samples in the first pair of flip-flops are the same value and the samples in the second pair of flip-flops are the same value;

wherein a frequency of the feedback clock signal is either the same as a frequency of the reference clock signal or a multiple of the frequency of the reference clock signal; and wherein the clock divider divides the feedback clock signal by a factor of at least two.

12. The integrated circuit of claim 11, wherein the first pair of flip-flops comprises:
   a first flip-flop having a data input coupled to the clock divider, a clock input configured to receive the reference clock signal, and an output; and
   a second flip-flop having a data input coupled to the output of the first flip-flop, a clock input configured to receive the reference clock signal, and an output.

13. The integrated circuit of claim 12, wherein the second pair of flip-flops comprises:
   a third flip-flop having a data input coupled to the clock divider, a clock input configured to receive the inversion of the reference clock signal, and an output; and
   a fourth flip-flop having a data input coupled to the output of the third flip-flop, a clock input configured to receive the inversion of the reference clock signal, and an output.

14. The integrated circuit of claim 13, wherein the detection circuit comprises:
   a first logic gate having inputs coupled to the output of the first flip-flop and the output of the second flip-flop, respectively, and an output;
   a second logic gate having inputs coupled to the output of the third flip-flop and the output of the fourth flip-flop, respectively, and an output; and
   a third logic gate having inputs coupled to the output of the first logic gate and the second logic gate, respectively.

15. The integrated circuit of claim 11, wherein the feedback clock detection circuit further comprises:
   an inverter configured to provide the inversion of the reference clock.

* * * * *